United States Patent
Lam et al.

(10) Patent No.: US 6,294,429 B1
(45) Date of Patent: Sep. 25, 2001

(54) METHOD OF FORMING A POINT ON A FLOATING GATE FOR ELECTRON INJECTION

(75) Inventors: Chung H. Lam, Williston; Dale W. Martin, Hyde Park; Christa R. Willets, Jericho, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/448,157

(22) Filed: Nov. 24, 1999

(51) Int. Cl.[7] .................................................. H01L 21/336
(52) U.S. Cl. ........................ 438/260; 438/257; 438/593; 257/317
(58) Field of Search ..................................... 438/257, 260, 438/264, 593, 201; 257/315, 317, 321

(56) References Cited

U.S. PATENT DOCUMENTS

| | | |
|---|---|---|
| 4,119,995 | 10/1978 | Simko . |
| 4,849,369 | 7/1989 | Jeuch et al. . |
| 5,028,553 | 7/1991 | Esquivel et al. . |
| 5,138,573 | 8/1992 | Jeuch . |
| 5,268,319 | 12/1993 | Harari . |
| 5,278,087 | 1/1994 | Jenq . |
| 5,332,914 | 7/1994 | Hazani . |
| 5,479,368 | 12/1995 | Kestbod . |
| 5,587,332 | 12/1996 | Chang et al. . |
| 5,596,213 | 1/1997 | Lee . |
| 5,753,951 | 5/1998 | Geissler . |
| 5,872,036 | * 2/1999 | Sheu . |
| 5,923,974 | * 7/1999 | Liang et al. . |
| 6,069,040 | * 5/2000 | Miles et al. . |
| 6,124,167 | * 9/2000 | Kao et al. . |
| 6,172,394 | * 1/2001 | Nakagawa . |

FOREIGN PATENT DOCUMENTS

| | | |
|---|---|---|
| 1081368 | 3/1989 | (JP) . |
| 5075135 | 3/1993 | (JP) . |

* cited by examiner

*Primary Examiner*—Charles Bowers
*Assistant Examiner*—Stephen W. Smoot
(74) *Attorney, Agent, or Firm*—DeLio & Peterson, LLC; Kelly M. Reynolds; William D. Sabo

(57) ABSTRACT

The present invention relates to a method of forming a charge injection region on a floating gate of a memory cell using an etching process. The present invention defines the sharp corners for electron charge injection region of a floating gate by etching the shape into the floating gate silicon rather than forming the injection point using an oxidation process. By using the etching process of the present invention, limitations on the size of the floating gate are overcome and the memory cell can be formed using the minimum geometry allowed by lithography. This allows further scaling of the cell film thickness than is presently capable and does not limit the choice of insulator film materials.

32 Claims, 3 Drawing Sheets

METHOD OF FORMING A POINT ON A FLOATING GATE FOR ELECTRON INJECTION

BACKGROUND OF THE INVENTION

1. Field of the Invention

The present invention relates generally to the manufacture of non-volatile memory devices, and more particularly to an improved method of forming a charge injection region on a floating gate of a memory cell.

2. Description of Related Art

In a non-volatile memory cell charge is stored on a floating gate comprised of a silicon body surrounded by a suitable insulator such as silicon dioxide. Typically, this floating gate is overlaid by a second conductive layer called the control gate which is connected to the circuit and has high voltage applied to it to cause charge to move across the insulating barrier.

One method to speed the process of removing charge from the floating body while keeping applied voltages low is to form a pointed feature on the body which enhances the electric field. In the simplest implementation of this idea, a square corner is formed when the body is defined and then the overlying conductor is shaped such that it wraps around this corner.

In Jenq, U.S. Pat. No. 5,278,087, a specific implementation of a source side injection NVRAM memory cell is disclosed. In this disclosure, a method to form injectors with an angle of less than the 90 degree square corner (and thus a higher electric field) is disclosed. In Jenq, a silicon layer is overlaid with a suitable oxidation blocking layer, e.g. silicon nitride, and an opening is made in this upper layer. The silicon is then oxidized. Due to the masking properties of the overlayer, and the fact that silicon oxidation grows "into" the silicon, a sloped recess is formed in the silicon film at the mask edge. The overlayer is then removed selectively to the silicon body and the silicon dioxide. Finally, the silicon layer is etched with an anisotropic dry etch such that what remains is the silicon dioxide layer with the portion of the silicon film beneath it. The resulting floating gate body will have a corner sharper than 90 degrees determined by the relative amount of oxidation and the specifics of the masking layer and oxidation process used.

"Scaling" is a necessary requirement of reducing costs of semiconductor components particularly in the field of very large scale integration (VLSI). The most obvious aspect of "scaling" is a reduction of the lengths and widths of specific features of semiconductor devices which usually requires a vertical scaling of the thickness of the films which are used to make the device. When a silicon film is oxidized it tends to oxidize faster along grain boundaries. In some cases the film will be broken up into individual islands. The oxidation may even proceed to the underlying single crystal silicon substrate which is the conductive channel for the device. The net result is that at some point in the scaling of the memory cell the oxidation process used to form the injection point becomes non-manufacturable.

A difficulty of Jenq is that the nature of the interface between the original silicon film and the overlying oxidation mask is critical. Any oxide, such as may grow in the room air or during insertion into a deposition tool used to produce the masking layer, provides an unintended path for oxidation and may enlarge and/or distort the shape of the final structure.

A further limitation of Jenq is that the resulting floating gate structure must have silicon dioxide as the insulator between itself and the control gate (since oxidation is used to provide this insulation) and the total thickness of the insulating layer is inherently restricted by the thickness of the silicon film (e.g. in the extreme limited to the result of total consumption of the film by oxidation).

Bearing in mind the problems and deficiencies of the prior art, it is therefore an object of the present invention to provide a method of forming a charge injection region on a floating gate.

It is another object of the present invention to provide a method of forming sharp corners in the gate material of a floating gate structure.

A further object of the invention is to provide a method of forming sharp corners on a floating gate of a memory cell with the minimum geometry allowed by lithography.

It is yet another object of the present invention to provide a method of alleviating oxidation size limitations on a floating gate of a memory cell.

It is yet another object of the present invention to provide a method of alleviating limits on the choice of insulator materials in forming a floating gate on a memory cell.

Still other objects and advantages of the invention will be in part obvious and will in part be apparent from the specification.

SUMMARY OF THE INVENTION

The above and other objects and advantages, which will be apparent to one of skill in the art, are achieved in the present invention which is directed to, in a first aspect, a method of forming a charge injection region on a floating gate of a semiconductor structure. The preferred embodiment of the method comprises providing a semiconductor structure having a plurality of layers and defining a floating gate region in the structure. A charge injection region is formed along an edge of the floating gate region by a first etching process and the floating gate is formed on the substrate. In the preferred embodiment the semiconductor structure comprises a first insulating layer over a semiconductor substrate, a first semiconductor layer over the insulating layer and a dielectric layer over the first semiconductor layer. It is preferred that the first insulating layer is a floating gate oxide, the first semiconductor layer is a floating gate silicon and the dielectric layer is silicon nitride.

The preferred embodiment of the method comprises defining the floating gate region by forming an opening in the dielectric layer to expose the first semiconductor layer. It is preferred that the opening be formed by first applying a resist pattern mask to the top of the dielectric layer, developing the resist pattern mask to expose portions of the dielectric layer, and then removing the exposed portions of the dielectric layer to form the opening. A reactive ion etch selective to the first semiconductor layer may be used to remove the exposed portions of the dielectric layer and to form the opening.

In the preferred method the first etching process comprises etching a trench in the first semiconductor layer. The trench has a bottom and a pair of sidewalls and may extend into the semiconductor layer to a depth in the range of approximately 10–20 nanometers. It is preferred to form the trench using an isotropic plasma etch, and it is most preferred to form the trench by etching slightly into the first semiconductor layer using a less nitride to silicon etch chemistry within approximately 50% isotropy.

The preferred method also comprises depositing a layer of a second insulating material into the trench and opening and removing the remaining portions of the dielectric layer to form a plug of the second insulating material over the first semiconductor layer. In the preferred embodiment, the second insulating layer is a chemical vapor deposition oxide. After depositing the layer of second insulating material in the trench and opening, it is preferred to polish the layer of the second insulating material to the top of the dielectric layer. The plug may be used as a mask over the first semiconductor layer and the exposed portions of the first semiconductor layer are removed to form the floating gate.

In another aspect, the present invention comprises a method of forming a point on a floating gate for electron injection. The method comprises the steps of: (a) providing a semiconductor substrate; (b) depositing a layer of a gate oxide material over the substrate; (c) depositing a layer of a gate silicon material over the gate oxide layer; (d) depositing a layer of silicon nitride over the gate silicon layer; (e) forming an opening in the silicon nitride layer to expose the gate silicon layer; (f) etching the gate silicon layer to form a trench having a bottom and pair of sidewalls with each of the sidewalls defining a sharp angle to a top edge; (g) depositing a layer of oxide in the trench and opening; (h) removing the silicon nitride layer wherein the oxide layer forms a plug over the gate silicon layer; and (i) removing the gate silicon layer using an oxide as a mask to form the floating gate wherein the sharp angle at the top edge of each of the sidewalls defines the point on the floating gate for electron charging injection. In the preferred embodiment, a reactive ion etch selective for nitride is used to form the opening in the silicon nitride layer to expose the gate silicon layer. It is also preferred to use an isotropic plasma etch to form the trench in the gate silicon layer, and it is most preferred to use a silicon etch chemistry with 50% isotropy. It is also preferred to remove the oxide from the surface of the silicon nitride layer such that the oxide layer is planar with silicon nitride layer after depositing the oxide in the trench opening. In the preferred embodiment, the amount of oxide deposited into the trench and opening is less than that required to fill the trench and opening.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
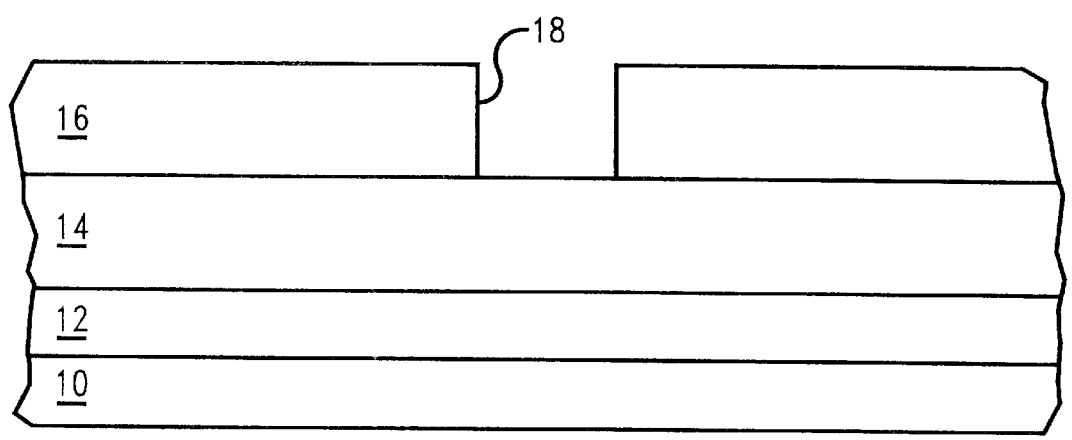
FIG. 1 is an elevational view of the semiconductor structure of the present invention after forming an opening in the dielectric layer.

In describing the preferred embodiment of the present invention, reference will be made herein to FIGS. 1–5 of the drawings in which like numerals refer to like features of the invention. Features of the invention are not necessarily shown to scale in the drawings.

In this invention, a reactive ion etching approach is utilized to form the sharp corners for electron charge injection. In forming the floating gate of the present invention, a layer of an electrically conductive material, such as polysilicon 14, is deposited on top of a layer of an insulating material or gate oxide 12 as shown in FIG. 1. Gate oxide layer 12 is grown on semiconductor substrate 10 which is preferably a silicon substrate. Polysilicon layer 14 can either be a blanket film, or if the final geometry of the floating gate is to be rectangular, then strips defining two sides of the final shape of the floating gate. The thickness of polysilicon layer 14 is generally about 50 to 2000 nanometers. A layer of silicon nitride 16 is preferably deposited on top of polysilicon layer 14. Depending on the operation of the non-volatile memory cell, the thickness of silicon nitride layer 16 can range from a few tenths of a nanometer to a few hundreds of a nanometer, and is preferably in the range of 0.05 to 0.3 micrometers.

Figure 2:
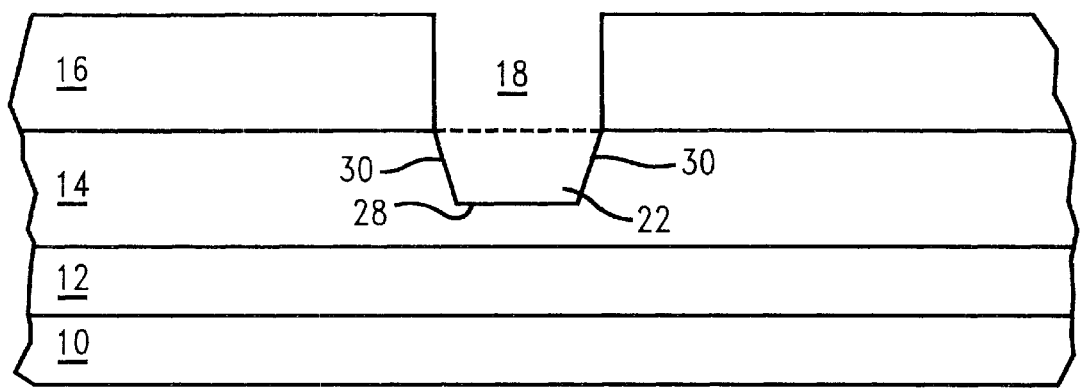
FIG. 2 is an elevational view of the semiconductor structure of the present invention after etching the charge injection shape in the floating gate silicon layer.

A resist pattern, such as a reverse floating gate, is masked and applied to the top of nitride layer 16. The mask is developed and nitride 16 is removed in the resist openings to form opening 18 as shown in FIG. 1. In the preferred embodiment, opening 18 is formed by a reactive ion etch process stopping on gate silicon layer 14 to remove the exposed nitride 16. When the reactive ion etch stops on polysilicon layer 14, it is preferred to switch to a different etch process, such as a isotropic plasma etch, to etch slightly into polysilicon layer 14 to form the desired injection shape, or trench 22, as shown in FIG. 2. As shown in FIG. 2, trench 22 has a bottom 28 and a pair of sidewalls 30. Each sidewall 30 forms an obtuse angle with the bottom 28 of trench 22. Preferably, the obtuse angle is in the range of 130° to 140°, and most preferably about 135°, but any recess improves the final shape. It is preferred to use a less nitride to silicon etch chemistry to etch slightly into polysilicon layer 14 with approximately a 50% isotropy. The amount of silicon removed, or the depth of trench 22, is preferably in the range of about 10 to 20 nanometers. The masking layer is then stripped and the wafer cleaned using a standard RCA 1 & 2 cleaning process. A typical RCA 1 cleaning process comprises 8:5:1 $H_2O:H_2O_2:NH_4OH$ at 35–65° C., while an RCA 2 cleaning process comprises 8:5:1 $H_2O:H_2O_2:HCl$ at 35–65° C. Many versions exist in terms of chemical ratios and temperatures. The preferred result is a balance nitride etch rate to silicon etch rate and vertical to horizontal etch rate (isotropy).

Figure 3:
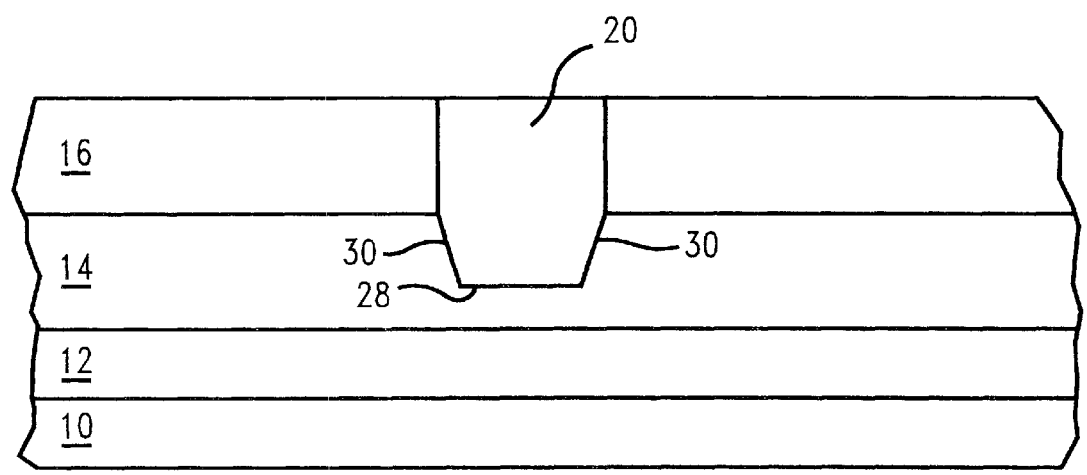
FIG. 3 is an elevational view of the semiconductor structure of the present invention after filling the charge injection shape and opening with an oxide.
Figure 4:
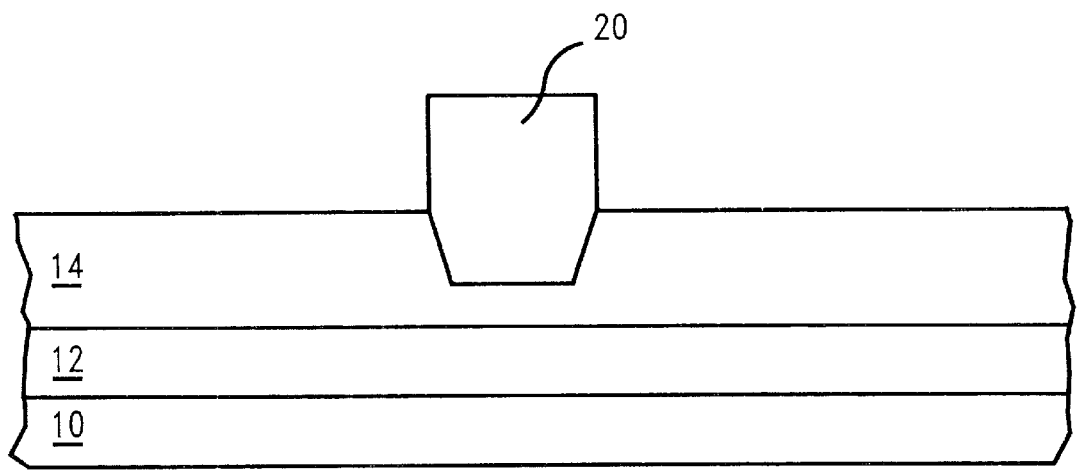
FIG. 4 is an elevational view of the semiconductor structure of the present invention after removal of the dielectric layer.

After stripping the resist material, trench 22 and opening 18 is filled with an oxide 20 and preferably polished to the top of nitride layer 16, as shown in FIG. 3. It is preferred to fill opening 18 and trench 22 with a chemical vapor deposition (CVD) oxide such as low pressure chemical vapor deposition (LPCVD) tetraethoxysilane (TEOS) or plasma enhanced chemical vapor deposition (PECVD) TEOS. The top of oxide 20 is preferably polished to the top of nitride layer 16 by a chemical mechanical polishing process stopping on nitride using techniques common for shallow trench isolation technology. The result is oxide plug 20, as shown in FIG. 3. Alternatively, oxide plug 20 may be formed by a deposition/etching process where an oxide is deposited sufficient into opening 18 and trench 22 sufficient to overfill the shape etched into the nitride film 16. An anistropic reactive ion etch is used to remove the oxide from the surface of nitride layer 16. A second alternative is to use a deposition/etching process where the amount of oxide deposited into trench 22 and opening 18 is less than that required to fill the shape formed in the nitride layer 16. This results in an oxide space formation which ultimately results (after the next two steps) in the patterning of two self aligned floating gate structures. The remaining silicon nitride 16 is removed, preferably using a hot phosphoric acid to expose polysilicon layer 14, except where oxide 20 was filled on top of polysilicon layer 14, as shown in FIG. 4. Alternatively, a chemical downstream etch can also be used to remove silicon nitride selective to silicon dioxide and silicon.

Figure 5:
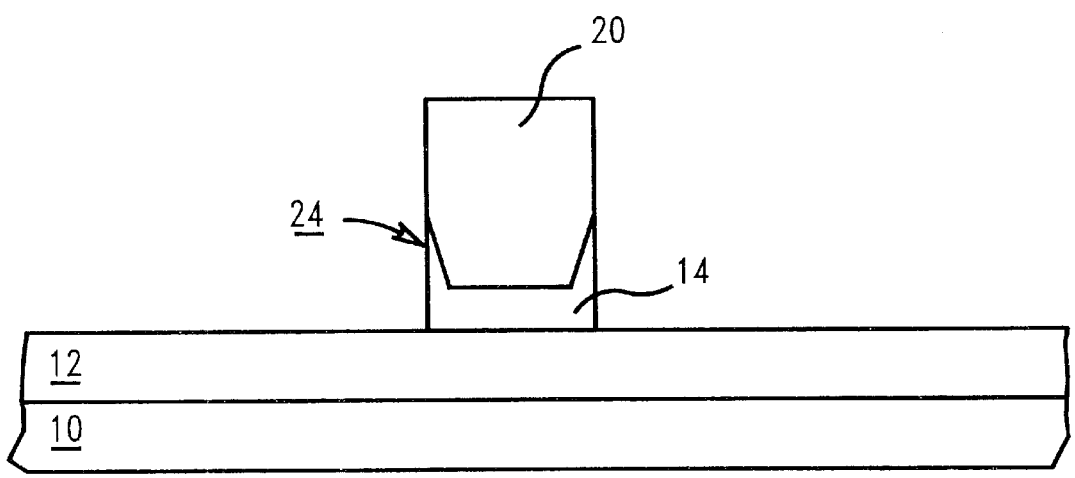
FIG. 5 is an elevational view of the semiconductor structure of the present invention after removal of the floating gate silicon leaving a floating gate island with sharp corners forming the electron charge injection regions of the floating gate.

Using oxide 20 as a mask, the exposed portions of polysilicon layer 14 are removed, preferably with a anistropic reactive ion etch which etches silicon selective to silicon dioxide, thus defining oxide plug 20 over floating gate silicon 14 with sharp corners 24 as shown in FIG. 5. This etching process can be any standard polysilicon gate etch process used in CMOS fabrication. Sharp corners 24 form the electron charge injection regions of the floating gate.

The reactive ion etching method of the present invention alleviates oxidation limitations such that sharp corners can be formed on a floating gate with the minimum geometry allowed by lithography. Using an etching method to produce the pointed electron injection region allows further scaling of the film thickness than is capable with the prior art oxidation method. Also, by using the etching process of the present invention the thickness of the insulator layers are only limited by the choice of the thickness of the overlying film.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming a charge injection region on a floating gate of a semiconductor structure comprising the steps of:
   providing said semiconductor structure, said semiconductor structure comprising a plurality of layers;
   defining a floating gate region in said semiconductor structure;
   forming said charge injection region having a trench along an edge of said floating gate region by a first etching process, said trench having a bottom and a pair of sidewalls, each of said sidewalls defining a sharp angle at a top edge; and
   forming said floating gate on said semiconductor structure using said trench etched into said charge injection region.

2. The method of claim 1 wherein said semiconductor structure comprises:
   a first insulating layer over a semiconductor substrate;
   a first semiconductor layer over said first insulating layer; and
   a dielectric layer over said first semiconductor layer.

3. The method of claim 2 wherein said first insulating layer is a floating gate oxide, said first semiconductor layer is a floating gate silicon, and said dielectric layer is silicon nitride.

4. The method of claim 2 wherein said floating gate region is defined by the step of forming an opening in said dielectric layer, said opening exposing said first semiconductor layer.

5. The method of claim 4 wherein said opening is formed by the steps of:
   applying a resist pattern mask to the top of said dielectric layer;
   developing said resist pattern mask to expose portions of said dielectric layer; and
   removing said exposed portions of said dielectric layer to form said opening.

6. The method of claim 5 wherein a reactive ion etch selective to said first semiconductor layer is used to remove said exposed portions of said dielectric layer and form said opening.

7. The method of claim 2 wherein said first etching process comprises etching said trench in said first semiconductor layer, said trench having said bottom and said pair of sidewalls.

8. The method of claim 7 wherein said trench is formed using an isotropic plasma etch.

9. The method of claim 7 wherein said trench is formed by etching slightly into said first semiconductor layer using said isotropic plasma etch to form a desired injection shape of said charge injection region.

10. The method of claim 7 wherein said trench extends into said first semiconductor layer to a depth in the range of approximately 10 to 20 nanometers.

11. The method of claim 7 further comprising the steps of:
    depositing a layer of a second insulating material in said trench; and
    removing the remaining portions of said dielectric layer to form a plug of said second insulating material over said first semiconductor layer.

12. The method of claim 11 wherein said second insulating layer is a chemical vapor deposition oxide.

13. The method of claim 11 further comprising the step, after depositing said layer of said second insulating material in said trench and opening, of polishing said layer of second insulating material to the top of said dielectric layer.

14. The method of claim 11 further comprising the step of using said plug as a mask over said first semiconductor layer and removing the exposed portions of said first semiconductor layer to form said floating gate.

15. A method of forming a point on a floating gate for electron injection comprising the steps of:
    (a) providing a semiconductor substrate;
    (b) depositing a layer of a gate oxide material over said substrate;
    (c) depositing a layer of a gate silicon material over said gate oxide layer;
    (d) depositing a layer of silicon nitride over said gate silicon layer;
    (e) forming an opening in said silicon nitride layer to expose said gate silicon layer;
    (f) etching said gate silicon layer to form a trench having a bottom and a pair of sidewalls, each of said sidewalls defining a sharp angle at a top edge;
    (g) depositing a layer of an oxide in said trench and opening;
    (h) removing said silicon nitride layer wherein said oxide layer forms a plug over said gate silicon layer; and
    (i) removing said gate silicon layer using said oxide as a mask to form said floating gate wherein said sharp angle at said top edge of each of said sidewalls defines said point on said floating gate for electron injection.

16. The method of claim 15 wherein a reactive ion etch selective for nitride is used to form said opening in step (e).

17. The method of claim 15 wherein in step (f) said etching comprises an isotropic plasma etch.

18. The method of claim 15 wherein in step (f) said etching etches into said gate silicon layer whereby each of said sidewalls forms an obtuse angle with said bottom of said trench.

19. The method of claim 15 further comprising the step, after step (g), of removing said oxide from the surface of said silicon nitride layer such that said oxide layer is planar with said silicon nitride layer.

20. The method of claim 15 wherein in step (g) the amount of oxide deposited into said trench and said opening is less than that required to fill said trench and opening.

21. A method of forming a charge injection region on a floating gate of a semiconductor structure comprising the steps of:

providing said semiconductor structure, said semiconductor structure comprising,
 a first insulating layer over a semiconductor substrate;
 a first semiconductor layer over said first insulating layer; and
 a dielectric layer over said first semiconductor layer;
 defining a floating gate region in said semiconductor structure;

forming said charge injection region along an edge of said floating gate region by a first etching process, said first etching process etching a trench in said first semiconductor layer, said trench having a bottom and a pair of sidewalls; and forming said floating gate on said semiconductor structure.

22. The method of claim 21 wherein said first insulating layer is a floating gate oxide, said first semiconductor layer is a floating gate silicon, and said dielectric layer is silicon nitride.

23. The method of claim 21 wherein said floating gate region is defined by the step of forming an opening in said dielectric layer, said opening exposing said first semiconductor layer.

24. The method of claim 23 wherein said opening is formed by the steps of:

applying a resist pattern mask to the top of said dielectric layer;

developing said resist pattern mask to expose portions of said dielectric layer; and removing said exposed portions of said dielectric layer to form said opening.

25. The method of claim 24 wherein a reactive ion etch selective to said first semiconductor layer is used to remove said exposed portions of said dielectric layer and form said opening.

26. The method of claim 21 wherein said trench is formed using an isotropic plasma etch.

27. The method of claim 21 wherein said trench is formed by etching slightly into said first semiconductor layer using said isotropic plasma etch to form a desired injection shape of said charge injection region.

28. The method of claim 21 wherein said trench extends into said first semiconductor layer to a depth in the range of approximately 10 to 20 nanometers.

29. The method of claim 21 further comprising the steps of:

depositing a layer of a second insulating material in said trench; and removing the remaining portions of said dielectric layer to form a plug of said second insulating material over said first semiconductor layer.

30. The method of claim 29 wherein said second insulating layer is a chemical vapor deposition oxide.

31. The method of claim 29 further comprising the step, after depositing said layer of said second insulating material in said trench and opening, of polishing said layer of second insulating material to the top of said dielectric layer.

32. The method of claim 29 further comprising the step of using said plug as a mask over said first semiconductor layer and removing the exposed portions of said first semiconductor layer to form said floating gate.

* * * * *

UNITED STATES PATENT AND TRADEMARK OFFICE
CERTIFICATE OF CORRECTION

PATENT NO. : 6,294,429 B1  
DATED : September 25, 2001  
INVENTOR(S) : Chung H. Lam et al.

Page 1 of 1

It is certified that error appears in the above-identified patent and that said Letters Patent is hereby corrected as shown below:

<u>Column 6, claim 9,</u>
Line 24, delete "said isotropic" and substitute therfor -- an isotropic --.

<u>Column 8, claim 27,</u>
Line 18, delete "said isotropic" and substitute therefor -- an isotropic --.

Signed and Sealed this

Twelfth Day of March, 2002

*Attest:*

*Attesting Officer*

JAMES E. ROGAN
*Director of the United States Patent and Trademark Office*